US006274866B1

(12) United States Patent
Li

(10) Patent No.: US 6,274,866 B1
(45) Date of Patent: Aug. 14, 2001

(54) SYSTEMS AND METHODS OF MASS SPECTROMETRY

(75) Inventor: Gangqiang Li, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/334,862

(22) Filed: Jun. 17, 1999

(51) Int. Cl.[7] .............................. H01J 49/40; H01J 37/29

(52) U.S. Cl. .......................... 250/287; 250/281; 250/282; 250/283; 250/396 R

(58) Field of Search .................................... 250/287, 281, 250/282, 283, 396 R

(56) References Cited

U.S. PATENT DOCUMENTS 5,753,909 * 5/1998 Park et al. .......................... 250/287
6,040,575 * 3/2000 Whitehouse et al. ................ 250/288

* cited by examiner

*Primary Examiner*—Bruce C. Anderson
*Assistant Examiner*—Nikita Wells

(57) ABSTRACT

The invention provides mass spectrometer systems, including time-of-flight mass spectrometers, and methods of performing mass spectroscopy. The systems are capable of operating in tandem or conventional mode. The systems include an ion reflector that, when operating in tandem mode, provides a discontinuous voltage to control the collision energy of the parent ions with the dissociation element. By controlling the collision energy, particular compositional information from the sample may be examined, such as specific bonding energies.

29 Claims, 5 Drawing Sheets

SYSTEMS AND METHODS OF MASS SPECTROMETRY

FIELD OF INVENTION

The invention relates generally to mass spectrometry, and more particularly to time-of-flight mass spectrometry using an ion reflector.

BACKGROUND OF THE INVENTION

Mass spectrometry is a widely used analytical technique for studying molecular structures in organic chemistry and biochemistry. Mass spectrometry techniques involve the production of ionized species from a material sample and the analysis of the species based on their mass and charge. Typically, a spectrum is generated that illustrates the relative abundance of species as a function of their mass (or mass-to-charge (M/Z) ratios in cases when ions may have a charge of greater than 1).

One type of mass spectrometer used for analysis is a time-of-flight mass spectrometer (TOFMS). In a conventional time-of-flight mass spectrometer, the ionized species are accelerated to the same kinetic energy by a potential field, and then allowed to drift in a field free region before striking a detector. The ionized species separate by mass, within the field free region, because lighter ions travel to the detector faster than heavier ions. By detecting the relative amounts of ions at different "flight times", a mass spectrum can be generated.

Tandem mass spectrometers (Tandem MS), including tandem time-of-flight mass spectrometers (Tandem TOFMS) have been developed to provide more information on the material being analyzed and, in particular, to permit improved discrimination between species that have similar mass-to-charge ratios. Typically, tandem MS techniques involve selecting only specific ions, having a particular mass-to-charge ratio, for analysis. The selected parent ions are then dissociated by introducing activation energy to form fragmented ions. The fragmented ions are analyzed to provide the information regarding the structures and origin of the parent molecule.

The following references and U.S. patents describe different mass spectrometry techniques.

Cooks (R. G. Cooks et al., Int. J. Mass Spectrom. Ion Processes. 100, p.209, 1990) discloses mass spectrometry techniques involving surface induced dissociation (SID) of parent ions. SID advantageously enables a high dissociation efficiency for large molecules.

A tandem TOFMS is described by Schey (K. L. Schey et al., Int. J. Mass Spectrom. Ion Processes. 77, p. 49, 1987) which employs a 45° stainless steel target for surface induced dissociation. Another tandem TOFMS is described by Williams (E. R. Williams et al., Int. J. Mass Spectrom. Ion Processes, 123, p. 233, 1993) in which an ion reflector is used as the dissociation target. Though both instruments demonstrated the ability to dissociate relatively large molecules up to mass 1,200 AMU, the instruments had a relatively low mass resolving power for fragment ions.

In U.S. Pat. No. 5,032,722, Boesl describes an MS/MS time-of-flight mass spectrometer. The spectrometer includes an ion source for generating a pulsed primary ion beam, a device for influencing the ions intermittently, in sharply defined areas, and an ion reflector for balancing out time-of-flight differences between ions of identical mass. The reflector includes a movable reflector end plate, which enables primary ions to be eliminated from the spectrum.

In U.S. Pat. No. 5,202,563, Cotter et al., describe a tandem time-of-flight mass spectrometer. The spectrometer incorporates two reflecting-type mass analyzers coupled via a collision chamber. The instrument uses specially designed flight channels that can be electrically floated with respect to the grounded vacuum housing. The design permits either pulsed extraction or constant field extraction of ions from the ionization source, in either low or high energy collisions in the collision chamber.

In U.S. Pat. No. 5,144,127, Williams et al., describes a tandem time-of-flight mass spectrometer that makes use of surface induced dissociation (SID). In one case, the SID surface can be maneuvered within the spectrometer.

Though the above-mentioned U.S. Patents and references describe mass spectrometers having a variety of different configurations, a need exists for a mass spectrometer that can operate in tandem mode to study detailed compositional information of a sample such as specific bond energies.

SUMMARY OF THE INVENTION

The invention provides mass spectrometer systems, including time-of-flight mass spectrometers, and methods of performing mass spectroscopy. The systems are capable of operating in tandem or conventional mode. When operating in tandem mode, the systems generate parent ions from a sample which are subsequently fragmented by a dissociation element to form fragmented ions. The systems include an ion reflector that, when operating in tandem mode, provides a discontinuous voltage to control the collision energy of the parent ions with the dissociation element and, in some embodiments, a second voltage that changes the energy of the fragmented ions. In preferred embodiments, the discontinuous voltage and the second voltage are applied as pulses.

In one aspect of the invention, a system for mass spectrometry is provided. The system includes an ion source capable of generating a plurality of parent ions from a sample. A portion of the parent ions follow a flight path. The system further includes an ion reflector constructed and arranged to receive the parent ions following the flight path and to apply a first, discontinuous voltage that changes the energy of the parent ions following the flight path. The system further includes a dissociation element positioned so that the parent ions, having an energy changed by the first, discontinuous voltage applied by the ion reflector, collide with the dissociation element thereby forming a plurality of fragmented ions. A portion of the fragmented ions continue to follow the flight path. The system further includes a detector positioned to detect the fragmented ions that follow the flight path.

In another aspect of the invention, the above-described system further includes electrical pulse circuitry electrically connected to the ion reflector and constructed and arranged to apply a first, discontinuous ion reflector voltage that changes the energy of the parent ions following the flight path.

In another aspect of the invention, another system for mass spectrometry is provided. The system includes an ion source capable of generating a plurality of parent ions from a sample. A portion of the parent ions follow a flight path. The system further includes an ion reflector constructed and arranged to receive the parent ions following the flight path and to apply a discontinuous voltage that changes the energy of the parent ions following the flight path. The system further includes a dissociation element positioned so that the parent ions, having an energy changed by the discontinuous voltage applied by the ion reflector, collide with the dissociation element thereby forming a plurality of fragmented ions. A portion of the fragmented ions continue to follow the flight path. The system further includes a second ion reflector constructed and arranged to receive the fragmented ions following the flight path and to apply a discontinuous voltage that changes the energy of the fragmented ions following the flight path. The system further includes a second dissociation element positioned so that the fragmented ions, having an energy changed by the discontinuous voltage applied by the second ion reflector, collide with the dissociation element thereby forming a plurality of second fragmented ions. A portion of the second fragmented ions continue to follow the flight path. The system further includes a detector positioned to detect the second fragmented ions that follow the flight path.

In another aspect of the invention, a method of mass spectrometry is provided. The method includes the step of generating a plurality of parent ions from a sample. The method further includes applying a first voltage that changes the energy of a portion of the parent ions following a flight path, and then turning the first voltage off. The method further includes fragmenting the portion of parent ions to form a plurality of fragmented ions. A portion of the fragmented ions continue to follow the flight path. The method further includes detecting the fragmented ions that follow the flight path.

In another aspect of the invention, another method of mass spectrometry is provided. The method includes generating a plurality of parent ions from a sample. The method further includes applying a first voltage that changes the energy of a portion of the parent ions following a flight path, and then turning the first voltage off. The method further includes fragmenting the portion of parent ions to form a plurality of fragmented ions A portion of the fragmented ions continue to follow the flight path. The method further includes applying a discontinuous voltage that changes the energy of said portion of fragmented ions. The method further includes fragmenting the fragmented ions having an energy changed by the discontinuous voltage to form a plurality of second fragmented ions. A portion of the second fragmented ions continuing to follow the flight path. The method further includes detecting the fragmented ions that follow the flight path.

Among other advantages, the system can be operated as both a conventional time-of-flight instrument and as a tandem time-of-flight instrument. While operating in conventional mode, the system is capable of analyzing parent ions over the entire mass (or M/Z ratio) range to generate a complete compositional spectrum for the sample. The system, while operating in tandem mode, enables the selection of parent ions having specific masses (or M/Z ratios) which are dissociated into fragmented ions that are detected to provide detailed information regarding the structures and origins of the sample's molecules. In particular, in tandem mode, the system can be used to determine the identity and arrangement of functional groups of the parent ions. For biomolecules, the system can be used to determine the amino acid sequence of a peptide.

Furthermore, in certain embodiments, the instrument provides a discontinuous voltage that changes the energies of the parent ions to permit precise control over their fragmentation energies (collision energies). By controlling the collision energy, particular compositional information such as specific bond energies may be studied.

In addition, the system permits high mass resolution for both parent and fragment ions. This enables sample compositional information to be precisely and accurately determined from the analysis.

The instrument is also advantageously of a simple and reliable construction. For example, the ion reflector does not utilize any mechanical moving parts which may lower the mass resolving power of the system.

Unless otherwise defined, all technical and scientific terms used herein have the same meaning as commonly understood by one of ordinary skill in the art to which this invention belongs. Although methods and systems similar or equivalent to those described herein can be used in the practice or testing of the present invention, suitable methods and systems are described below. All publications, patent applications, patents, and other references mentioned herein are incorporated by reference in their entirety. In case of conflict, the present specification, including definitions, will control. In addition, the systems, methods, and examples are illustrative only and not intended to be limiting.

Other advantages, novel features, and aspects of the invention will become apparent from the following detailed description of the invention when considered in conjunction with the accompanying figures, and from the claims.

DETAILED DESCRIPTION OF THE INVENTION

The invention provides time-of-flight mass spectrometer systems that include an ion reflector that provides a discontinuous voltage, preferably in the form of a voltage pulse. The discontinuous voltage permits the control of the collision energy of the parent ions, as described further below.

Figure 1:
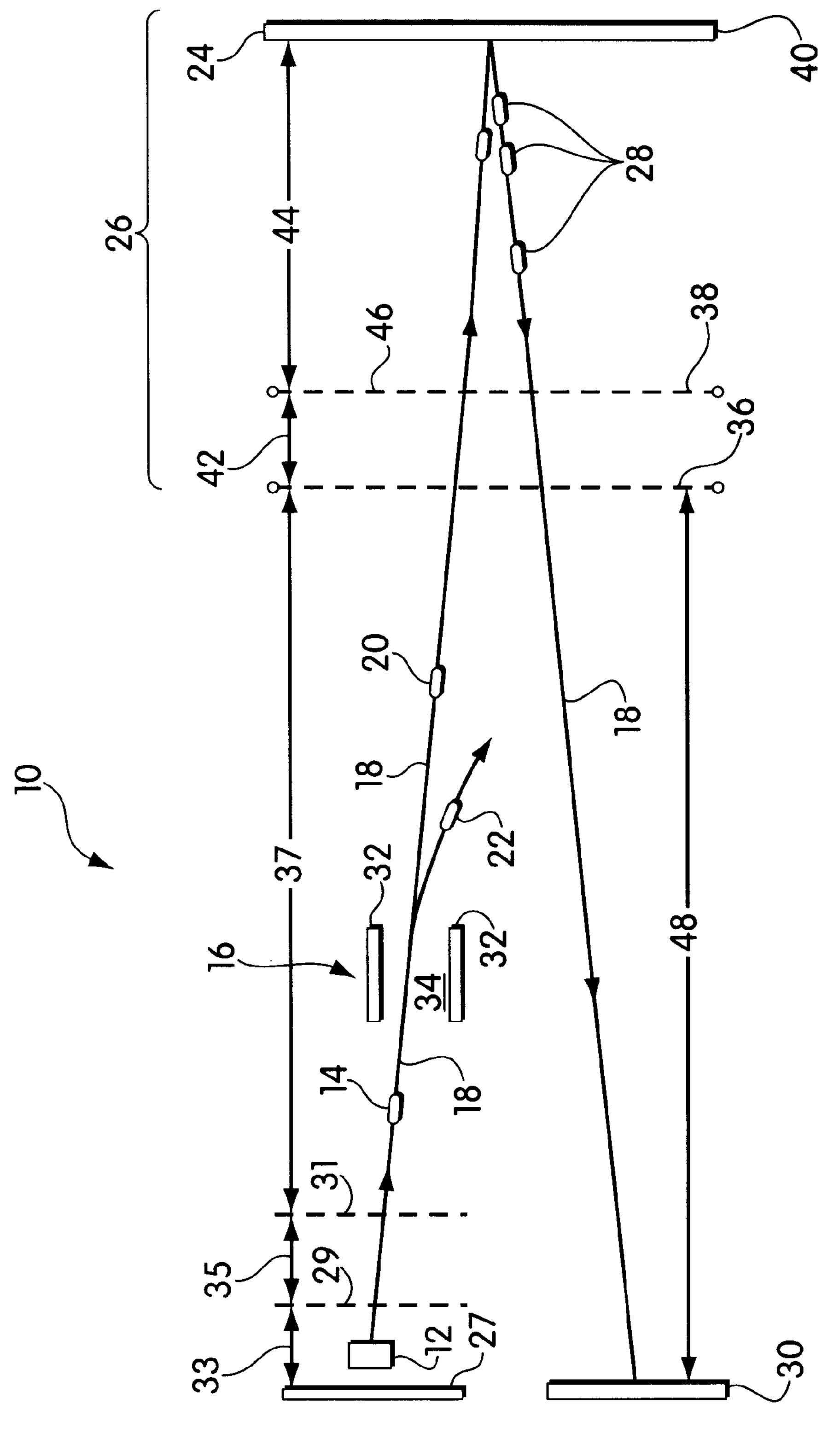
FIG. 1 schematically illustrates a time-of-flight mass spectrometer system when operating in tandem mode according to the invention.

Referring to FIG. 1, a mass spectrometer system 10 of the invention is schematically illustrated when operating in tandem mode. The system includes an ion source 12 which generates parent ions 14 from a sample. A portion of the parent ions pass through an ion selector 16 which is designed to function in certain embodiments when the system operates in tandem mode, but typically does not function when the system operates in conventional mode, as described further below. When functioning, the ion selector applies a deflection voltage such that selected parent ions 20, continue along a flight path 18, while unselected parent ions 22 are deflected from the flight path. The selected parent ions 20, while traveling toward a dissociation element 24, are retarded by a first, discontinuous voltage provided by an ion reflector 26. That is, the voltage provided by the ion reflector is turned off prior to the parent ions colliding with the dissociation element 24. After the voltage is turned off, the parent ions drift at a particular energy (the collision energy) dependent upon the parent ions initial energy, the magnitude of the voltage, and the time interval over which the voltage is applied. The parent ions collide with the dissociation element 24 to form fragmented ions 28, a portion of which continue along flight path 18 away from the element. Then, the ion reflector typically applies a second voltage that accelerates the fragmented ions to a constant energy. The fragmented ions thus separate in space by their mass, with lighter ions traveling faster than heavier ions in proportion to their mass. A portion of the fragmented ions impinge upon a detector 30 which measures the relative abundance of ions as a function of their mass to provide information regarding the structure of the sample's molecules, such as bond energies. The above-described components of the system are arranged in a vacuum chamber that, generally, is placed under vacuum conditions of about $10^{-5}$ to about $10^{-8}$ torr during operation.

Ion source 12 may be any of the type well known in the art for generating ions from the molecules of the sample. Generally, ion source 12 functions by stimulating electron transitions in the molecules of a sample to produce ionic species. In certain embodiments, ion source 12 generates ions by electron impact (EI) in which a beam of electrons interacts with sample molecules in the gas phase. In the interaction, sample molecules lose an electron, leaving positively charged ionic species. In other embodiments, ion source 12 generates ions using a Matrix-Assisted Laser Desorption Ionization (MALDI) technique. In this technique, the sample is dissolved in a solution and irradiated with a laser pulse to form ions.

Ion source 12 is positioned within a region 33 between a first electrode 27 and a second electrode 29. The system also include a third electrode 31 that along with the second electrode defines a region 35. In the embodiment of FIG. 1, electrode 27 is a solid plate and electrodes 29, 31 are grids that permit the passage of the parent ions therethrough, though other suitable types of electrodes may be used. The electrodes are connected to a voltage source (not shown) to provide respective voltages ($U_p$ and $U_o$) that accelerate the parent ions generated by ion source 12 across regions 33 and 35. The voltage source can be a commercially available instrument, for example, that is capable of generating a voltage pulse. The voltages are selected to space-focus the parent ions, as known in the art, for the purpose of increasing their mass resolution.

After passing through electrode 31, the parent ions enter a field free region 37. Ion selector 16 includes two parallel plates 32 and is arranged within field free region 37 so that the parent ions following flight path 18 pass through a space 34 between the plates. A voltage source (not shown) connected to the plates provides a potential difference across space 34. The voltage source can be a commercially available instrument, for example, that is capable of generating a voltage pulse. In other embodiments, the ion selector 18 can be any of the variety of other constructions known in the art for providing a potential including a pulsed comb filter, or a pulsed retarding grid which is described in U.S. Pat. No. 5,654,543, issued to the present inventor, and is incorporated herein by reference.

When functioning, ion selector 16 applies a predetermined voltage to the parent ions 14 passing through space 34 at a selected time after the generation of the parent ions. The voltage and time are chosen to permit selected parent ions 20 to travel along flight path 18 toward dissociation element and to deflect unselected parent ions 22 away from the dissociation element. Typically, the voltage and time are chosen to select parent ions based on their mass or their mass-to-charge (M/Z) ratio. (Generally, the parent ions have a charge equal to one so the mass is equal to the mass-to-charge ratio.) In some cases, parent ions having a specific mass are selected, while in other cases parent ions having multiple masses are selected. As a result of the selection process, essentially all of the fragmented ions 20 which are subsequently measured by the detector are formed from selected parent ions. In particular, the selection process enables detailed compositional information regarding the parent ions (e.g. bond energies and molecular structure) to be ascertained in cases when only parent ions having a specific mass are selected.

The selected parent ions follow flight path 18 within region 37 before entering ion reflector 26. The ion reflector includes a series of electrodes 36, 38, and 40 aligned in parallel and connected to a voltage source which generates the voltages that retard the parent ions. The voltage source includes electrical pulse circuitry, as known in the art, electrically connected to the ion reflector to generate discontinuous voltages. The voltage source can be a commercially available instrument, for example, that is capable of generating a discontinuous waveform. In certain embodiments, the ion reflector voltage source, the ion selector voltage source, and the voltage source that provides a voltage to electrodes 27, 29, and 31 are connected with timing circuitry to synchronize the voltages applied during operation.

The series of electrodes 36, 38, and 40 enables the ion reflector to apply different voltages in different regions of the ion reflector. For example, a specific voltage may be applied in a region 42 between electrode 36 and electrode 38, while a different voltage is applied in a region 44 between electrodes 38 and electrode 40. In certain preferred cases, the voltage applied in region 44 may be turned off before the parent ions strike dissociation surface 24, as discussed further below.

Electrodes 36 and 38, in the embodiment of FIG. 1, are ring-shaped electrodes that include metallic screens 46 that extend across their respective inner diameters to promote the even distribution of the potential field throughout region 42. The electrodes are arranged in the system so that flight path 18 is through their respective inner diameters and the screens are designed to have a high transparency to permit the passage of a large percentage of the parent ions therethrough. In other embodiments, as known in the art, electrodes 36 and 38 are plates having holes, or grids having periodic spaces, through which the parent ions travel. In the embodiment of FIG. 1, electrode 40, the final electrode in the series, is a solid metallic plate. In this embodiment, electrode 40 also functions as dissociation element 24. In other embodiments, electrode 40 may be of similar construction as electrodes 36 and 38 and may not function as the dissociation element.

The first voltage applied by the ion reflector slows the motion of the selected parent ions, thereby reducing their energy, prior to colliding with dissociation element 24. The ion reflector is designed to apply the first voltage discontinuously which advantageously permits precise control over the collision energy, that is the energy with which the parent ions collide with the dissociation element. In typical operation, when the parent ions have been slowed to a particular energy, but before they have collided with the dissociation element, the first voltage is turned off. The parent ions drift toward the dissociation element and collide with dissociation element at this same particular energy. In this manner, the collision energy can thus be controlled by selecting the magnitude of the applied voltage and the time duration over which it is applied. In particular, the systems are designed and operated under conditions that permit control over a wide range of collision energies (e.g. 1 eV to 4000 eV) by varying the time duration of the applied voltage, as discussed further below and illustrated in Example 1.

Figure 2:
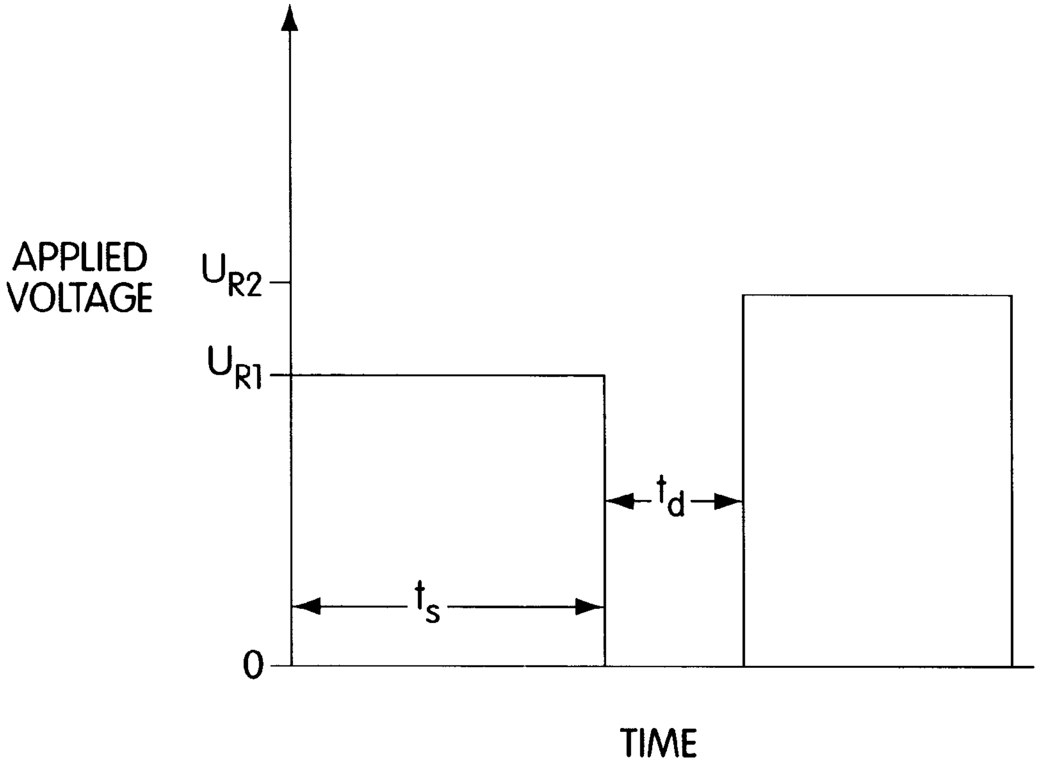
FIG. 2 graphically illustrates the voltage applied by an ion reflector of the invention as a function of time during a measurement.

Typically, the voltage applied to the parent ions (first voltage, $U_{R1}$) is in the range of 4000 volts to 5000 volts. In preferred embodiments, the ion reflector applies the discontinuous voltage in the form of a square pulse. The voltage pulse, preferably, starts when the parent ions are generated by the ion source and is turned off after a time interval $t_s$ (the switching time). The switching time, thus, is equal to the total flight time of the parent ions before the pulse is turned off. In typical systems, switching times are on the order of microseconds and can be controlled within nanoseconds. FIG. 2, which illustrates the variation of voltage applied by the ion reflector with time, graphically shows the first voltage pulse applied over a time interval $t_s$.

As described above, dissociation element 24 also functions as the final electrode in the ion reflector in the embodiment of FIG. 1. In other embodiments, the dissociation element is a separate component from the ion reflector. The dissociation element, in these embodiments, can be any of a variety of types as known in the art which are used to fragment ions, and typically, is a metallic plate having a generally planar surface.

The collision of the selected parent ions with the dissociation element provides sufficient energy to break bonds within the ions thereby generating fragmented ions 28. Typically, a single parent ion dissociates into several fragmented ions. In these cases, the masses of the fragmented ions when added together equal the mass of the original parent ion. The parent ions fragment into specific forms depending upon their bond energies and the collision energy. Therefore by controlling the collision energy and measuring how the parent ions fragment, it is possible to analyze particular bond energies within the molecules of the sample.

A portion of the fragmented ions generated from the collision with the dissociation element travel along flight path 18 away from the dissociation element and back through ion reflector 26. At a selected time (dissociation time, $t_d$) after the first voltage has been discontinued, that is turned off, the ion reflector applies a second voltage. Typically, the second voltage is applied across region 44 and region 42 of the ion reflector 26. The magnitude of the second voltage is selected, as known in the art, to space-focus the fragmented ions at the detector to increase their mass resolution when measured at the detector. Under typical operating conditions, the second voltage ($U_{R2}$) has a value between about 1000 volts and 8000 volts, and more typically between about 4000 volts and 5000 volts. In certain embodiments, the second voltage may have a different magnitude than the discontinuous voltage, and in other embodiments the second voltage may have the same magnitude as the discontinuous voltage. Typically, the second voltage has the same sign as the first voltage, that is the second voltage provides a potential field in the same direction as the potential field provided by the first voltage. Preferably, the second voltage is applied in the form of a square pulse over a time interval on the order of microseconds. FIG. 2 graphically shows the second pulse applied over a time interval $t_d$. The second voltage accelerates the fragmented ions to a constant energy prior to exiting the ion reflector. After passing through the screen covering electrode 36, the fragmented ions enter a field-free region 48 that extends from the ion reflector to detector 30. Within this region, because the fragmented ions have the same energy, they separate in space by mass. That is, the fragmented ions travel through region 48 at a velocity in proportion to their mass. For example, lighter ions travel faster than heavier ions having the same energy. Because the fragmented ions separate by mass within region 48, ions having different masses (or M/Z ratios) will strike the surface of detector 30 at different times.

The detector may be any of the type known in the art and, as illustrated, is a micro-channel plate. When the fragmented ions strike the detector, secondary electrons are generated which are converted into an electrical signal. The detector measures electrical signal as a function of time to obtain a spectrum showing the relative abundance of each fragmented ion mass. The spectrum can be analyzed to determine compositional information for the sample, and in particular, information regarding molecular structure and bond energy.

Figure 3:
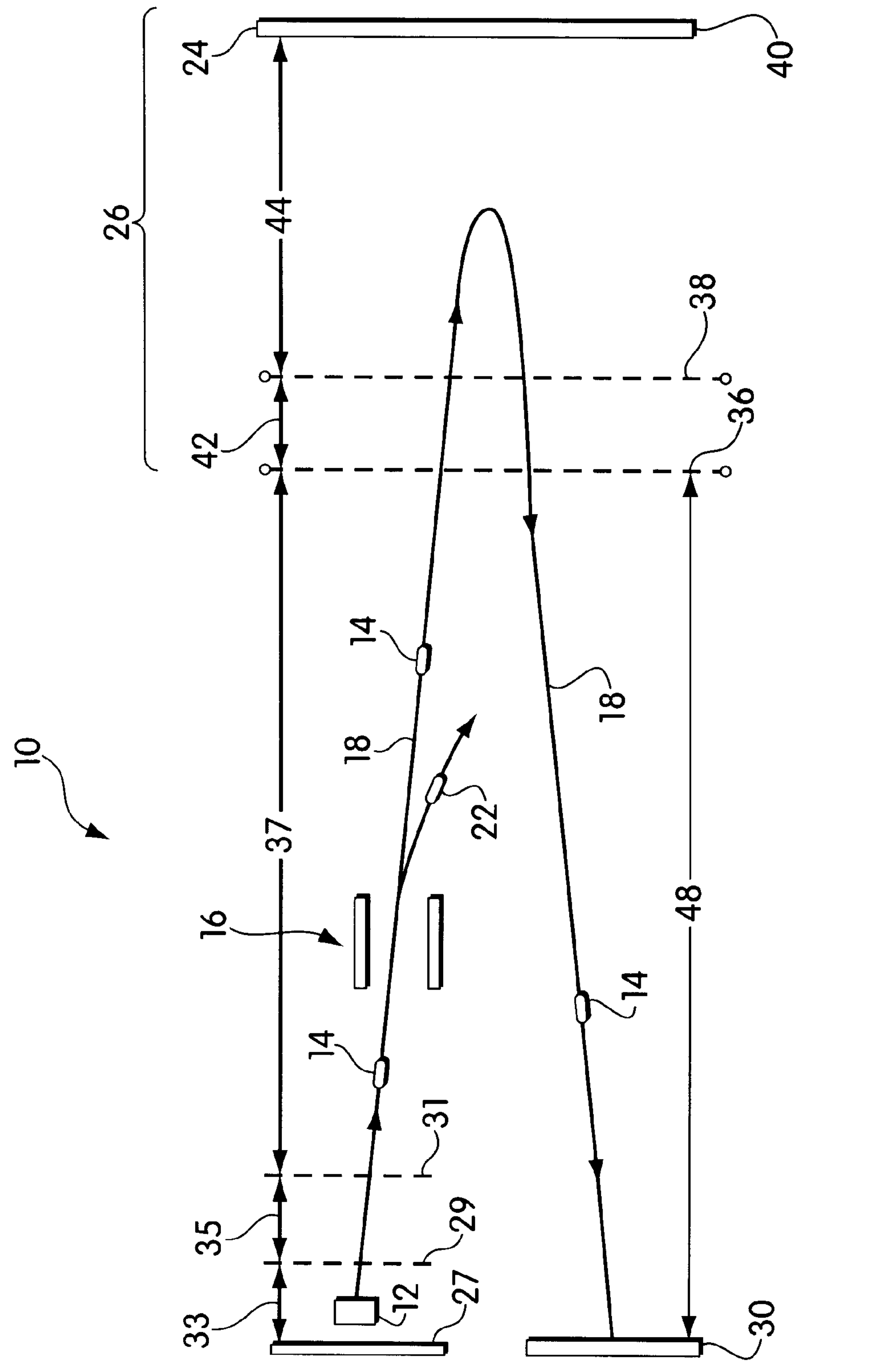
FIG. 3 schematically illustrates the time-of-flight mass spectrometer system of FIG. 1 when operating in conventional mode according to the invention.

Referring to FIG. 3, the system of FIG. 1 is schematically illustrated when operating in conventional mode. In conventional operation, parent ions 14 are generated by ion source 12 and space-focused by electrodes 27, 29, and 31 in a similar manner as described above with respect to tandem mode operation. However the ion selector, in conventional mode, typically is not utilized to select parent ions having a particular mass (or M/Z ratio). Parent ions over the full range of mass emitted from the sample, therefore, follow flight path 18 into ion reflector 26. The ion reflector is of similar construction, as described above, and provides a continuous retarding voltage in regions 42 and 44. The magnitude of the voltage is selected to reverse the direction of the parent ions 14 following flight path 18 prior to their impingement upon dissociation element 40. Therefore, unlike in tandem mode operation, fragmented ions are not generated in conventional mode operation. The continuous voltage applied by the ion reflector accelerates the parent ions which have reversed direction to a constant energy. Thus, after exiting the ion reflector, the parent ions separate according to their mass within the field-free region 48 and then strike detector 40. The detector, as described above, measures the electrical signal generated by the impinging ions as a function of time to produce a mass spectrum.

The spectrum generated by the system of FIG. 3 contains information over the entire mass range of parent ions emitted from the sample, however, it typically does not provide highly specific structural information (e.g. bond energies and molecular structure) that can be obtained from a fragmented ion spectrum generated in tandem mode. In preferred methods of operation, the system may first be run in conventional mode (FIG. 3) to generate a complete spectrum. Then, the complete spectrum is used to select a specific parent ion mass (or M/Z ratio) for further analysis. The system is then run in tandem mode (FIG. 1), with the ion selector 24 appropriately configured to select parent ions having the particular mass (or M/Z ratio), as described above, to generate a spectrum having detailed information regarding the particular parent ion.

Figure 4:
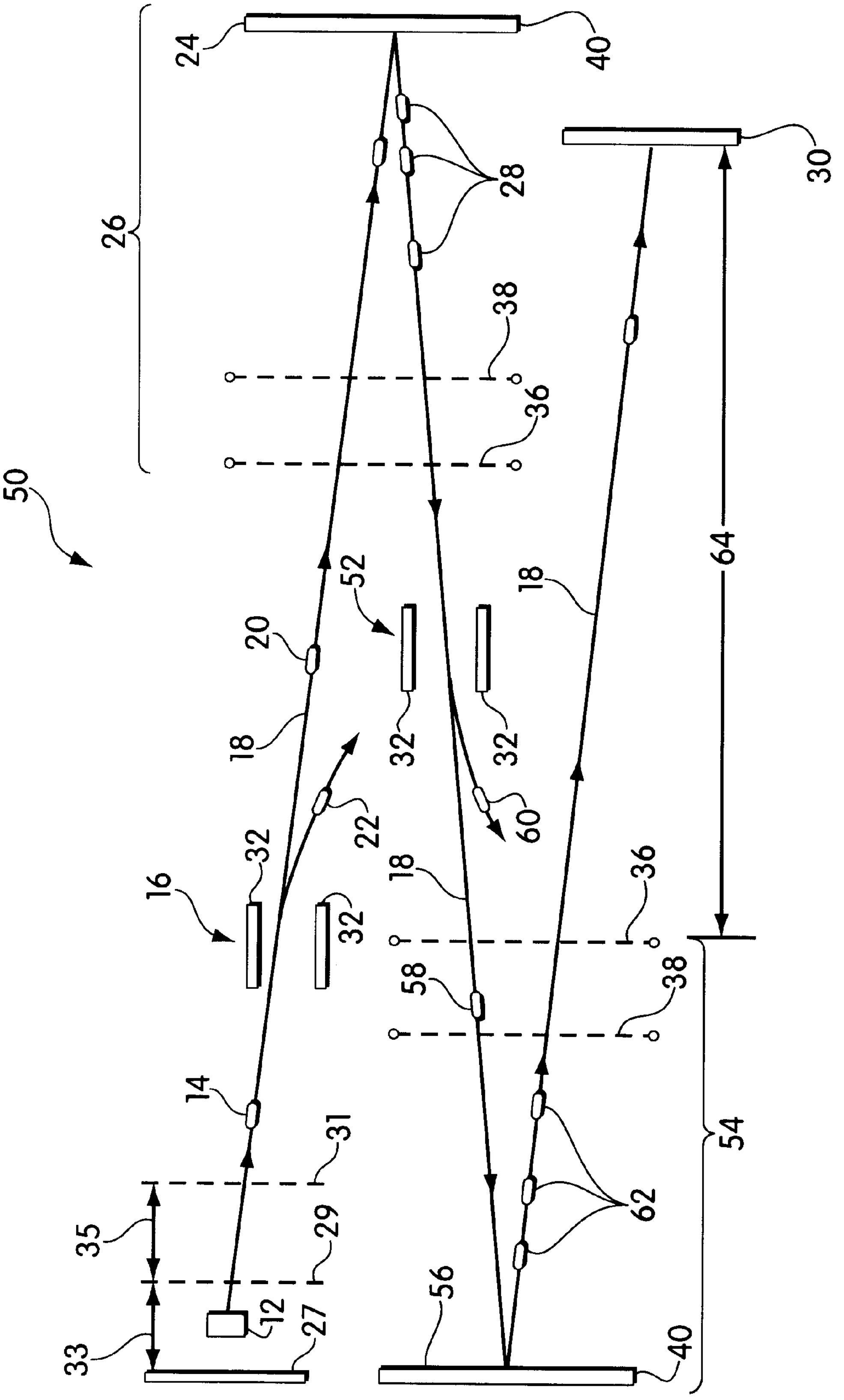
FIG. 4 schematically illustrates an MS/MS/MS time-of-flight mass spectrometer system according to the invention.

Referring to FIG. 4, another embodiment of the invention, an MS/MS/MS spectrometer system 50 is schematically illustrated. In addition to including the components of the above-described system 10, system 50 further includes a second ion selector 52, a second ion reflector 54 and a second dissociation element 56.

During operation in tandem MS/MS/MS mode, system 50 generates fragmented ions 28 in a manner identical to the above-described system 10 operating in tandem mode as illustrated in FIG. 1. In system 50, the fragmented ions 28, after exiting ion reflector 26, pass through the two parallel plates of second ion selector 52. In preferred embodiments, the second ion selector functions, as described above, to select ions based on their mass (or M/Z ratio) so that selected fragmented ions 58 continue along flight path 18, while other fragmented ions 60 are deflected away from the flight path. In other embodiments, the second ion selector may not function. The selected fragmented ions enter second ion reflector 54 which, as described above, applies a discontinuous field that slows the selected fragmented ions to a selected energy and, then, is turned off prior to the ions striking second dissociation element 56. The fragmented ions collide with the second dissociation element, at the selected collision energy, to generate second fragmented ions 62. A portion of the second fragmented ions continue along flight path 18 away from the second dissociation element. After a selected time period, the second ion reflector applies a second voltage to the second fragmented ions which accelerates the ions to a constant energy after which the second fragmented ions pass through electrode 36 and enter a field-free region 64. While traveling across the field-free region the ions separate according to mass, as described above, so that ions of different mass strike detector 30 at different times. The detector measures the electrical signal as a function of time to generate a spectrum showing the relative abundance of ions of different mass.

In some cases, system 50 provides more detailed compositional and structural information than obtained using the tandem MS system illustrated in FIG. 1. In particular, system 50 in certain embodiments is useful in improving the mass resolving power. System 50 may be further modified to include additional respective ion reflectors, ion selectors, and dissociation elements. System 50 can also operate in conventional mode as a multi-reflection time-of-flight mass spectrometer.

The function and advantages of the above-described embodiment of the present invention will be more fully understood from the example below. The following example is intended to illustrate the benefits of the present invention, but does not exemplify the full scope of the invention.

PROPHETIC EXAMPLE

Mass Spectrometer System

A mass spectrometer system includes a stainless steel vacuum chamber which is evacuated by employing a two-stage vacuum pumping system comprising an EXT250 type molecular pump (Edwards High Vacuum International, Wilmington, Mass.) and an RT type mechanical Rotary pump (Edwards High Vacuum International, Wilmington, Mass.) as a backing pump. The pumps are operated to provide a vacuum in the range of $10^{-5}$ to $10^{-8}$ Torr in the chamber during operation of the system.

The system utilizes a matrix assistant laser desorption/ionization (MALDI) source. An HP8130A type pulse generator (Hewlett Packard Company, Palo Alto, Calif.) is connected to a conventional pulse amplifier DEI H-V 1000 (Direct Energy Inc. Fort Collins, Colo.) which is connected to electrodes (27, 29 and 31 in FIG. 1) to provide a voltage for ion generation and extraction from the ion source. A second HP8130A type pulse generator (Hewlett Packard Company, Palo Alto, Calif.) is connected to a second conventional pulse amplifier DEI H-V 1000 (Direct Energy Inc. Fort Collins, Colo.) which is connected to the electrodes (32 in FIG. 1) of the ion selector to provide a voltage for ion selection. An HP 33120 function/arbitrary waveform generated is connected to a third conventional pulse amplifier DEI H-V 1000 (Direct Energy Inc. Fort Collins, Colo.) which is connected to the electrodes (36, 38 and 40 in FIG. 1) of the ion reflector to provide a discontinuous voltage. The two HP8130A type pulse generators and the HP 33120 function/arbitrary waveform are connected with a timing circuit to synchronize the voltages applied during operation.

Typical dimensions of the system are as follows as specified with reference to the Figures. The distance (region 33) between electrode 27 and electrode 20 is 0.01 m. The distance (region 35) between electrode 29 and electrode 31 is 0.05 m. The distance (region 37) between electrode 31 and electrode 36 is 1.0 m. The distance 42 between electrode 36 and electrode 38 is 0.02 m. The distance (region 44) between electrode 38 and electrode 40 (the dissociation element) is 0.20 m.

When the system is run in tandem MS mode, typical operating conditions are as follows as specified with reference to the above detailed description and the Figures. The voltage ($U_p$) applied across region 33 between electrodes 27 and 29 is 2000 V. The voltage ($U_o$) applied across region 35 between electrodes 29 and 31 is 10,000 V. The first voltage ($U_{R1}$) applied to the parent ions is 8000 V. The second voltage ($U_{R2}$) applied to the fragmented ions is 4600 V.

For the system with the above-described dimensions and operated at the above-described conditions, the relation between the switching time $t_s$, and collision energy $K_r$ for a parent ion of mass m=1000 AMU and a charge q=1 e, is determined by:

$$t_s=36.26-0.2K_r^{1/2}[\mu s],$$

with $K_r$ measured in eV.

Figure 5:
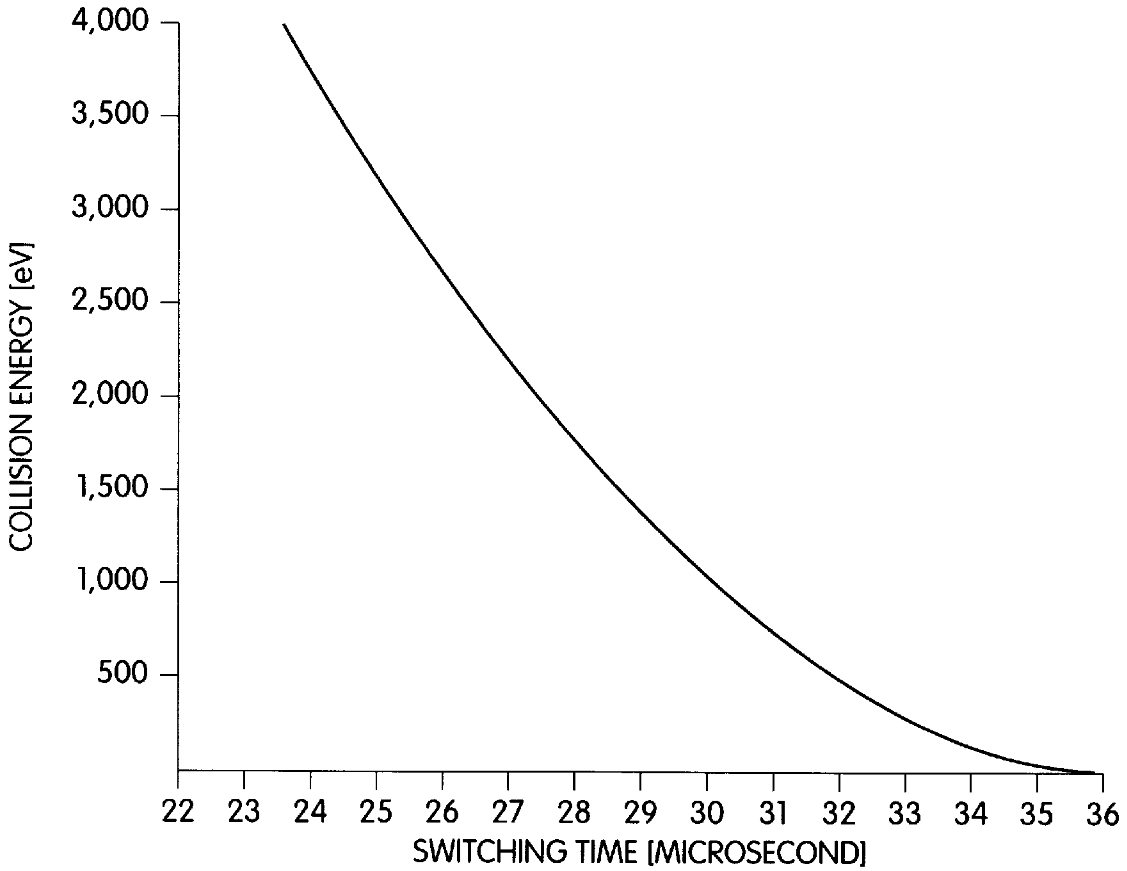
FIG. 5 is a graph of collision energy as a function of switching time for the system and parameters described in Example 1 according to the invention.

FIG. 5 is a plot of the collision energy $K_r$ as a function of switching time $t_s$, according to the above relation. The plot shows that by varying $t_s$ from approximately 36.2 μs to 23.5 μs, the collision energy can be varied from 1 eV to 4000 eV. The plot also shows that because switching time can be controlled to within nanoseconds, the collision energy can be controlled within 1 eV. The example, thus, illustrates that the system advantageously can be used to examine a specific collision energy selected from a broad range of different collision energies.

Those skilled in the art would readily appreciate that all parameters listed herein are meant to be exemplary and that actual parameters will depend upon specific application for which the methods and apparatuses of the invention are used. It is, therefore, to be understood that the foregoing embodiments are presented by way of example only and that, within the scope of the appended claims and equivalents thereto, the invention may be practiced otherwise than as specifically described.

What is claimed is:

1. A system for mass spectrometry comprising:

an ion source capable of generating a plurality of parent ions from a sample, a portion of the parent ions following a flight path;

an ion reflector constructed and arranged to receive the parent ions following the flight path and to apply a first, discontinuous voltage that changes the energy of the parent ions following the flight path;

a dissociation element positioned so that the parent ions, having an energy changed by the first, discontinuous voltage applied by the ion reflector, collide with the dissociation element thereby forming a plurality of fragmented ions, a portion of the fragmented ions continuing to follow the flight path; and a detector positioned to detect the fragmented ions that follow the flight path.

2. The system of claim 1, wherein the ion reflector is constructed and arranged to apply a second voltage that changes the energy of the fragmented ions continuing to follow the flight path to a constant energy prior to the fragmented ions being detected by the detector.

3. The system of claim 1, wherein the ion reflector is constructed and arranged to apply the first, discontinuous voltage as a first voltage pulse that changes the energy of the parent ions.

4. The system of claim 2, wherein the ion reflector is constructed and arranged to apply the second voltage as a second voltage pulse that changes the energy of the fragmented ions.

5. The system of claim 2, wherein the first, discontinuous voltage has a different value than the second voltage.

6. The system of claim 1, wherein the first, discontinuous voltage has a value of between 4200 Volts and 5000 Volts.

7. The system of claim 2, wherein the second voltage has a value of between 1000 Volts and 8000 Volts.

8. The system of claim 3, wherein the time of the first voltage pulse is between 23.5 $\mu$s and 36.2 $\mu$s.

9. The system of claim 1, wherein the discontinuous voltage changes the energy of the parent ions to a selected collision energy.

10. The system of claim 1, wherein the ion reflector comprises a series of electrodes including at least a first electrode and a final electrode, the first electrode being constructed to permit the passage of parent ions therethrough.

11. The system of claim 10, wherein the dissociation element comprises the final electrode in the series of electrodes.

12. The system of claim 1, wherein the dissociation element comprises a metallic plate.

13. The system of claim 1, further comprising an ion selector positioned to receive said portion of the parent ions from the ion source prior to the parent ions being received by the ion reflector, the ion selector designed to permit selected parent ions from said portion to continue to follow the flight path to the ion reflector and to deflect other parent ions from the flight path.

14. The system of claim 13, wherein the ion selector comprises a first and a second electrode arranged in parallel so that the parent ions following the flight path pass therethrough.

15. The system of claim 13 wherein the ion selector selects parent ions based on mass.

16. A system for mass spectrometry comprising:

an ion source capable of generating a plurality of parent ions from a sample, a portion of the parent ions following a flight path;

an ion reflector constructed and arranged to receive the parent ions following the flight path and to apply a discontinuous voltage that changes the energy of the parent ions following the flight path;

a dissociation element positioned so that the parent ions, having an energy changed by the discontinuous voltage applied by the ion reflector, collide with the dissociation element thereby forming a plurality of fragmented ions, a portion of the fragmented ions continuing to follow the flight path;

a second ion reflector constructed and arranged to receive the fragmented ions following the flight path and to apply a discontinuous voltage that changes the energy of the fragmented ions following the flight path;

a second dissociation element positioned so that the fragmented ions, having an energy changed by the discontinuous voltage applied by the second ion reflector, collide with the dissociation element thereby forming a plurality of second fragmented ions, a portion of the second fragmented ions continuing to follow the flight path; and a detector positioned to detect the second fragmented ions that follow the flight path.

17. The system of claim 16, wherein the second ion reflector is constructed and arranged to apply a second voltage that changes the energy of the second fragmented ions following the flight path to a constant energy prior to the second fragmented ions being detected by the detector.

18. The system of claim 16, further comprising a second ion selector positioned to receive said portion of the fragmented ions prior to the fragmented ions being received by the second ion reflector, the second ion selector designed to permit selected fragmented ions from said portion to continue along the flight path to be received by the ion reflector and to deflect other parent ions from the flight path.

19. A system for mass spectrometry comprising:

an ion source capable of generating a plurality of parent ions from a sample;

an ion reflector positioned to receive parent ions generated by the ion source via a flight path;

electrical pulse circuitry electrically connected to the ion reflector and constructed and arranged to apply a first, discontinuous ion reflector voltage that changes the energy of the parent ions following the flight path;

a dissociation element positioned so that the parent ions, having an energy changed by the discontinuous voltage applied by the ion reflector, collide with the dissociation element thereby forming a plurality of fragmented ions, a portion of the fragmented ions continuing to follow the flight path; and a detector positioned to detect the fragmented ions that follow the flight path.

20. The system of claim 19, wherein the electrical pulse circuitry is adjustable to apply the first, discontinuous ion reflector voltage as a first voltage pulse.

21. The system of claim 19, wherein the electrical pulse circuitry is adjustable to apply a second voltage that changes the energy of the fragmented ions continuing to follow the flight path to a constant energy prior to the fragmented ions being detected by the detector.

22. A method of mass spectrometry comprising:

generating a plurality of parent ions from a sample;

applying a first voltage that changes the energy of a portion of the parent ions following a flight path;

turning the first voltage off;

fragmenting said portion of parent ions to form a plurality of fragmented ions, a portion of the fragmented ions continuing to follow the flight path; and detecting the fragmented ions that follow the flight path.

23. The method of claim 22, further comprising applying a second voltage to the fragmented ions following the flight path that changes the energy of the fragmented ions to a constant energy prior to the fragmented ions being detected.

24. The method of claim 22, wherein applying a first voltage comprises applying a first voltage pulse.

25. The method of claim 23, wherein applying a second voltage comprises applying a second voltage pulse.

26. The method of claim 22, further comprising selecting a portion of the parent ions following the flight path to continue to follow the flight path and deflecting other parent ions from the flight path prior to applying the first voltage.

27. A method of mass spectrometry comprising:

generating a plurality of parent ions from a sample;

applying a first voltage that changes the energy of a portion of the parent ions following a flight path;

turning the first voltage off;

fragmenting said portion of parent ions to form a plurality of fragmented ions, a portion of the fragmented ions continuing to follow the flight path;

applying a discontinuous voltage that changes the energy of said portion of fragmented ions;

fragmenting the fragmented ions having an energy changed by the discontinuous voltage to form a plurality of second fragmented ions, a portion of the second fragmented ions continuing to follow the flight path; and detecting the fragmented ions that follow the flight path.

28. The method of claim 27, further comprising applying a voltage to the second fragmented ions following the flight path that changes the energy of the second fragmented ions to a constant energy prior to the fragmented ions being detected.

29. The method of claim 27, further comprising selecting a portion of the fragmented ions following the flight path to continue to follow the flight path and deflecting other fragmented ions from the flight path prior to applying the discontinuous voltage.

* * * * *